US012802750B2

(12) United States Patent
Gu et al.

(10) Patent No.: US 12,802,750 B2
(45) Date of Patent: Nov. 17, 2026

(54) COMPUTE-IN-MEMORY PROCESSOR SUPPORTING BOTH GENERAL-PURPOSE CPU AND DEEP LEARNING

(71) Applicant: Northwestern University, Evanston, IL (US)

(72) Inventors: Jie Gu, Evanston, IL (US); Yuhao Ju, Morton Grove, IL (US)

(73) Assignee: Northwestern University, Evanston, IL (US)

( * ) Notice: Subject to any disclaimer, the term of this patent is extended or adjusted under 35 U.S.C. 154(b) by 81 days.

(21) Appl. No.: 18/737,007

(22) Filed: Jun. 7, 2024

(65) Prior Publication Data

US 2024/0412781 A1 Dec. 12, 2024

Related U.S. Application Data

(60) Provisional application No. 63/506,771, filed on Jun. 7, 2023.

(51) Int. Cl.

| | |
|---|---|
| ***G06F 7/501*** | (2006.01) |
| ***G11C 11/419*** | (2006.01) |
| ***G11C 11/54*** | (2006.01) |

(52) U.S. Cl.

CPC ............ *G11C 11/419* (2013.01); *G06F 7/501* (2013.01); *G11C 11/54* (2013.01)

(58) Field of Classification Search

CPC ........ G11C 11/419; G11C 11/54; G06F 7/501
USPC .................................................. 365/189.011
See application file for complete search history.

(56) References Cited

U.S. PATENT DOCUMENTS

| | | | | |
|---|---|---|---|---|
| 12,579,416 | B1 * | 3/2026 | Duong | G06N 3/048 |
| 2022/0391128 | A1 * | 12/2022 | Jain | G06F 7/523 |
| 2023/0205729 | A1 * | 6/2023 | Gu | G06F 15/8046 712/10 |
| 2023/0284139 | A1 * | 9/2023 | Ma | H04B 7/0626 370/329 |
| 2024/0232127 | A1 * | 7/2024 | Vilim | G06F 15/7871 |
| 2024/0233068 | A1 * | 7/2024 | Vilim | G06T 3/02 |
| 2024/0355004 | A1 * | 10/2024 | Zaghetto | H04N 19/147 |
| 2024/0362994 | A1 * | 10/2024 | Daoura | G08C 17/02 |

OTHER PUBLICATIONS

H. Genc et al, "Gemmini: Enabling Systematic Deep-Learning Architecture Evaluation via Full-Stack Integration", 58th IEEE/ACM Design Automation Conference (DAC), Dec. 2021.

(Continued)

*Primary Examiner* — Ly D Pham

(74) *Attorney, Agent, or Firm* — Benesch Friedlander Coplan & Aronoff LLP

(57) ABSTRACT

In certain aspects, a compute-in-memory processor includes central computing units configured to operate in a central processing unit mode and a deep neural network mode. A data activation memory and a data cache output memory are in communication with the compute-in-memory processor. In the deep neural network mode, the data activation memory is configured as input memory and the data cache output memory is configured as output memory. In the central processing unit mode, the data activation memory is configured as a first data cache and the data cache output memory is configured as a register file and a second data cache.

17 Claims, 14 Drawing Sheets

(56) References Cited

OTHER PUBLICATIONS

H. E. Sumbul et al., "System-Level Design and Integration of a Prototype AR/VR Hardware Featuring a Custom Low-Power DNN Accelerator Chip in 7nm Technology for Codec Avatars" 2022 IEEE Custom Integrated Circuits Conference (CICC), Apr. 2022.
F. Tu et al., "A 28nm 29.2TFLOPS/W BF16 and 36.5TOPS/W INT8 Reconfigurable Digital CIM Processor with Unified FP/INT Pipeline and Bitwise In-Memory Booth Multiplication for Cloud Deep Learning Acceleration" ISSCC, 2022.
Y.-D. Chih et al., "A 22nm 4Mb 8b-Precision ReRAM Computing-in-Memory Macro with 11.91 to 195.7TOPS/W for Tiny AI Edge Devices", ISSCC, 2021.
Wang et al., "A Compute SRAM with Bit-Serial Integer/Floating-Point Operations for Programmable In-Memory Vector Acceleration", ISSCC, 2019.
Ju et al., "A 65nm Systolic Neural CPU Processor for Combined Deep Learning and General-Purpose Computing with 95% PE Utilization, High Data Locality and Enhanced End-to-End Performance" ISSCC, 2022.
B. Zimmer et al., "A Risc-V Vector Processor With Simultaneous-Switching Switched-Capacitor DC-DC Converters in 28 nm FDSOI", JSSC, vol. 51, No. 4, Apr. 2016.
A. Gonzalez et al., "A 16mm2 106.1 GOPS/W Heterogeneous RISC-V Multi-Core Multi-Accelerator SoC in Low-Power 22nm FinFET" IEEE 47th European Solid State Circuits Conference (ESSCIRC), 2021.
K. Patsidis et al., "RISC-V2: A Scalable RISC-V Vector Processor", ISCAS, 2020.
M. Perotti et al., "A "New Ara" for Vector Computing: An Open Source Highly Efficient Risc-V V 1.0 Vector Processor Design", ASAP, 2022.

* cited by examiner

Customized CIM Instruction Set

58

Instruction 32b

| 28 | 24 | 23 | 16 | 15 |
|---|---|---|---|---|
| Location | Opcode | R07mm | R1 | RD7mm |

3 Bit for Locations of R0, R1 and RD, 0 Means in DAMEM (Top), 1 for DOMEM (Bottom)

| Type | Opcode | R0 | R1 | RD | #Cycle |
|---|---|---|---|---|---|
| Vector Boolean | VAND, VOR, VXOR, VNAND, VNOR, VXNOR | | | | 1 |
| Vector Arithmetic | VADD | | | | 1 |
| | VSUB | | | | 1 |
| | VMUL | | | | 4 |
| | VMULH | | | | 4 |
| Vector Shift | VSLL | | | | 1 |
| | VSRL,VSRA | | | | 1 |

| Type | Opcode | R0 | R1 | RD | #Cycle |
|---|---|---|---|---|---|
| Vector Move | VMV | | | | 1 |
| | VMVI | Imm | | | 1 |
| Vcompare | >, <, = | | | | 1 |
| Jump | JMP | | | | 1 |
| Branch | >, <, = | | | Imm | 1 |
| Special Functions | MVCSR | | | CSR | 1 |
| | SWITCH | | | | 2 |
| | PCS | Imm | | | 1 |

#Cycles is Based on 32b Operations

MVCSR: Move Data to Control and Status Registers

PCS: Stop and Hold PC for DNN Mode

SWITCH: Switch Mode from Vector CPU to DNN Mode 34 28

FIG. 5

62

Comparison Table

| | ISSCC | ISSCC | ISSCC | ISSCC | This Work |
|---|---|---|---|---|---|
| Process | 28nm | 22nm | 28nm | 65nm | 65nm |
| Area (mm2) | 6.69 | 0.202 (Macro) | 2.55 | 4.47 | 1.52 |
| Architecture | DNN | DNN | CPU | CPU+DNN | CPU+DNN |
| Type | Digital CIM | Digital CIM | Digital CIM | Digital | Digital CIM |
| CPU Power | - | - | - | 589mW@1V (10 Cores) | 4.89mW@1V (4 Cores) |
| DNN Power | 69.4m@1V | 35mW@0.72V | - | 116mW@1V | 8.4mW@1V |
| Bit Precision | INT8, INT16 | INT4, INT8 | Arbitrary | INT8, INT32 | INT8, INT32 |
| Max Frequency | 220MHz | - | 475MHz | 400MHz | 245MHz |
| Norm. Supply Vdd | 1.0V | 0.72V | 1.1V | 1.0v | 1.0v |
| Marco Size | 12KB | 8KB | 16KB | - | 9KB |
| DNN SoC Efficiency (TOPS/W) | 19.5 (1V, 8b) | - | - | 0.66 (1V, 8b) | 7.62 (1V, 8b) |
| DNN Marco Efficiency (TOPS/W) | 30.8 (1V, 8b) | 24.7 (0.72V, 8b) | Add: 2.2 (1V, 8b) Mul: 0.22 (1V, 8b) | - | 14.8 (1V, 8b) 23.5 (0.7V, 8b) |
| CPU Performance (GOPS) | - | - | Add: 27.6 (1V, 32b) Mul: 0.75 (1V, 32b) | Add: 4 1V, 32b) Mul: 1 (1V, 32b) | Add: 3.92 (1V, 32b) Mul: 0.98 (1V, 32b) |
| CPU Efficiency (GOPS/W) | - | - | *Add: 550 (1V, 32b) *Mul: 19.7 (1V, 32b) | Add: 6.79 (1V, 32b) Mul: 2.35 (1V, 32b) | Add: 802 (1V, 32b) Mul: 144.7 (1V, 32b) |

*Scale up to 32b. Original Data for 8b Operation: 2.2TOPS/W (Add) and 220gOPS/W (Mul)

FIG. 7
(Continued)

COMPUTE-IN-MEMORY PROCESSOR SUPPORTING BOTH GENERAL-PURPOSE CPU AND DEEP LEARNING

CROSS-REFERENCE TO RELATED APPLICATION

The present application claims the benefit of priority under 35 U.S.C. § 119 from U.S. Provisional Patent Application Ser. No. 63/506,771 entitled "Compute-in-Memory Processor Supporting Both General-Purpose CPU and Deep Learning," filed on Jun. 7, 2023, the disclosure of which is hereby incorporated by reference in its entirety for all purposes.

STATEMENT OF FEDERALLY FUNDED RESEARCH OR SPONSORSHIP

This invention was made with government support under grant number CCF-2008906 awarded by the National Science Foundation. The government has certain rights in the inventions.

TECHNICAL FIELD

The present disclosure generally relates to compute-in-memory circuits, and more specifically to compute-in-memory processors supporting both general-purpose CPU and deep learning.

BACKGROUND

While some progress has been made for compute-in-memory (CIM) techniques, for end-to-end operations of AI-related tasks, a general-purpose computing unit, e.g. CPU, is not only mandatory but also often dominates the total latency due to significant pre/post-processing, data movement/alignment and versatile non-MAC tasks. Conventional architecture which engages the CPU core, ASIC/CIM accelerator, and a deep memory access (DMA) engine for data transfer can suffer from processor stall and under-utilization issues. Deep neural network (DNN) computing often takes only 12%-50% of total run time leaving performance bottlenecked by CPU processing and data transfer. For instance, 83% of run time was spent by CPU for data movement and preparation from the recent augmented reality/virtual reality system-on-a-chip (AR/VR SoC). Unfortunately, current CIM developments do not support general-purpose CPU and do not address the needed improvements for CPU related processing and data transfer.

The description provided in the background section should not be assumed to be prior art merely because it is mentioned in or associated with the background section. The background section may include information that describes one or more aspects of the subject technology.

SUMMARY

According to certain aspects of the present disclosure, a compute-in-memory processor is provided. The compute-in-memory processor includes central computing units configured to operate in a central processing unit mode and a deep neural network mode. A data activation memory and a data cache output memory are in communication with the compute-in-memory processor. In the deep neural network mode, the data activation memory is configured as input memory and the data cache output memory is configured as output memory. In the central processing unit mode, the data activation memory is configured as a first data cache and the data cache output memory is configured as a register file and a second data cache.

According to another aspect of the present disclosure, a method is provided. The includes operating central computing units in a central processing unit mode; wherein, in the central processing unit mode, a data activation memory in communication with the central computing units is configured as a first data cache and a data cache output memory, in communication with the central computing units, is configured as a register file and a second data cache. The method includes selectively operating the central computing units from the central processing unit mode to a deep neural network mode, wherein, in the deep neural network mode, the data activation memory is configured as input memory and the data cache output memory is configured as output memory.

According to other aspects of the present disclosure, a compute-in-memory processor is provided. The compute-in-memory processor includes central computing units configured to operate in a central processing unit mode and a deep neural network mode. A first level cache and a second level cache are in communication with the central processing units. The second level cache includes a plurality of SRAM banks. In the central processing unit mode, a second level compute-in-memory in communication with the second level cache is configured as an instruction controlled compute-in-memory core. In the deep neural network mode, the second level compute-in-memory is configured as a weight memory for compute-in-memory MAC operations.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. It should be noted that although various aspects may be described herein with reference to healthcare, retail, educational, or corporate settings, these are examples only and are not to be considered limiting. The teachings of the present disclosure may be applied to any mobile device environments, including but not limited to home environments, healthcare environments, retail environments, educational environments, corporate environments, and other appropriate environments. Accordingly, the drawings and detailed description are to be regarded as illustrative in nature and not as restrictive.

BRIEF DESCRIPTION OF DRAWINGS

The disclosure is better understood with reference to the following drawings and description. The elements in the figures are not necessarily to scale, emphasis instead being placed upon illustrating the principles of the disclosure. Moreover, in the figures, like-referenced numerals may designate to corresponding parts throughout the different views.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Figure 1:
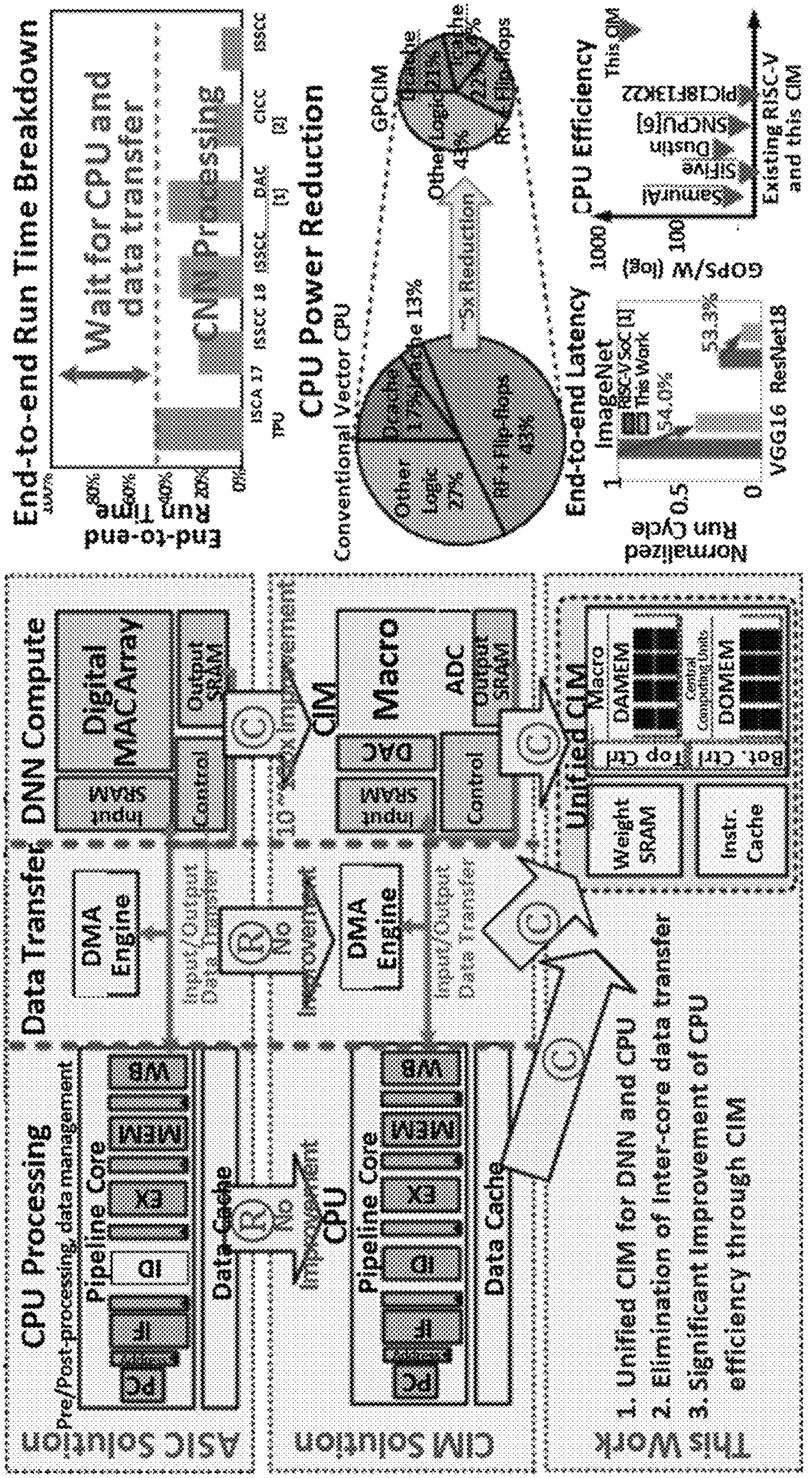
FIG. 1 schematically illustrates conventional architecture contrasted with features of an unified CIM for deep neural network (DNN) and CPU of the disclosed technology.

FIG. 1 schematically illustrates conventional architecture contrasted with features of an unified CIM for deep neural network (DNN) and central processing unit (CPU) of the disclosed technology. The conventional architecture which engages a CPU core, ASIC/CIM accelerator, and a deep memory access (DMA) engine for data transfer suffers from processor stall and underutilization issues. DNN computing often takes only 12% to 50% of total run time leaving performance bottlenecked by CPU processing and data transfer. For instance, 83% of run time was spent by CPU for data movement and preparation from the recent AR/VR SoC. Unfortunately, current compute-in-memory (CIM) developments do not support both CPU and deep learning, and therefore, do not address the need for improvements for CPU related processing and data transfer. In certain aspects of the present disclosure, on the other hand, a unified general purpose CIM (GPCIM) architecture, which obtains high efficiency for both DNN and vector instruction-based CPU, is provided. In certain aspects, the disclosed technology addresses these deficiencies found in the conventional architecture and provides advantages including, but not limited to, (1) a unified digital CIM architecture has been developed for both vector CPU and DNN operations; (2) best-in-class energy efficiency has been achieved on the vector CPU by exploiting the simpler pipeline, removal of cache access and data locality of CIM architecture; (3) overcoming the inter-core data transfer overhead in conventional architecture by constructing special dataflow and dedicated instruction for seamless data sharing between CPU and DNN operations rendering significant improvement on end-to-end performance. For example, in certain aspects, a 65 nm test chip is developed to demonstrate the state-of-the-art energy efficiency from the GPCIM processor for both DNN (23.5TOPS/W) and CPU (802GOPS/W) tasks in end-to-end real-time applications.

In certain aspects of the present disclosure, a general-purpose compute-in-memory (GPCIM) processor combining DNN operations and vector CPU is provided. Utilizing special reconfigurability, dataflow, and instruction set, a 65 nm test chip, for example, demonstrates a 28.5 TOPS/W DNN macro efficiency and a best-in-class peak CPU efficiency of 802GOPS/W. Benefit from a data locality flow, 37% to 55% end-to-end latency improvement on AI-related applications is achieved by eliminating inter-core data transfer.

Figure 2:
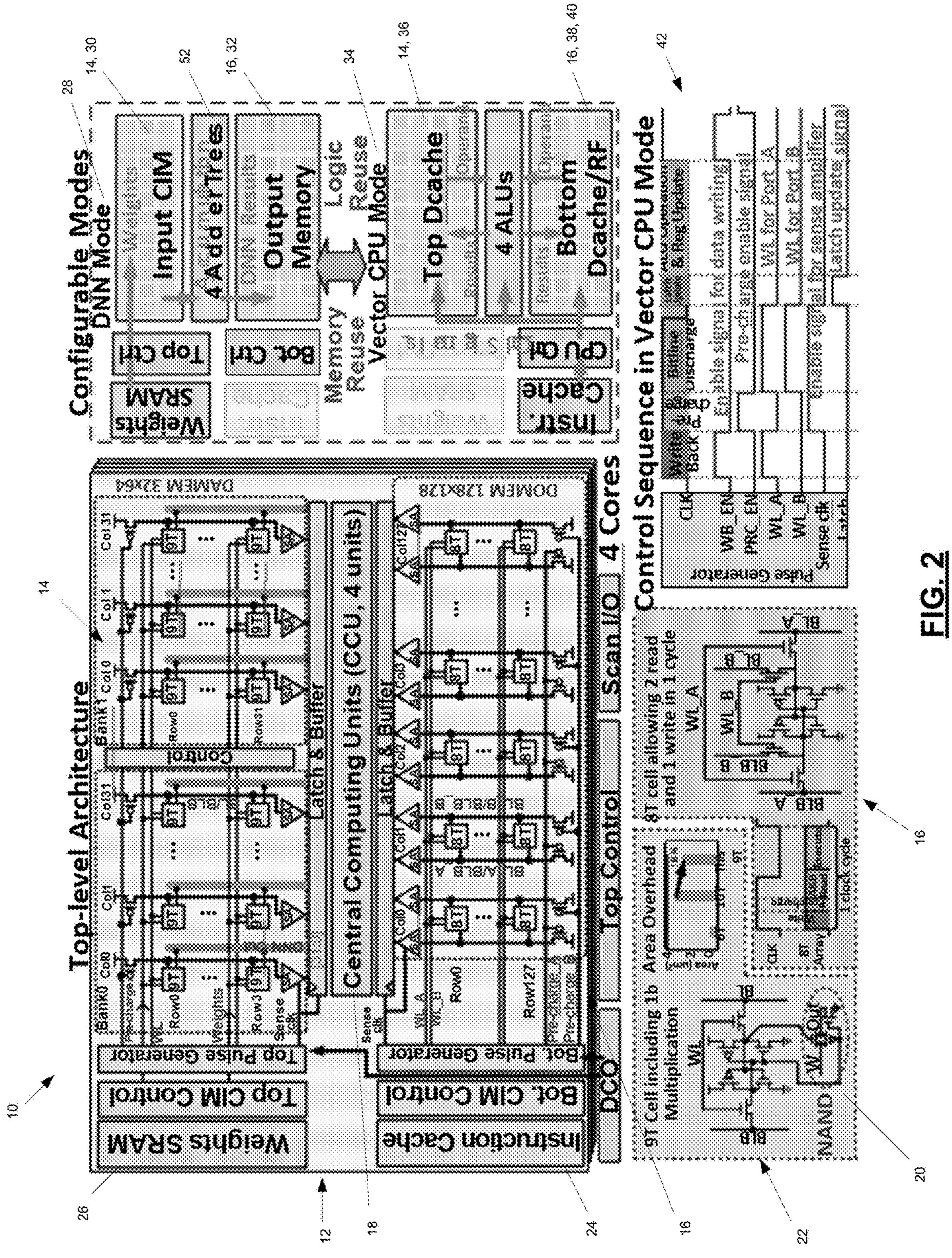
FIG. 2 schematically shows a CIM macro of a GPCIM, which contains a Data Cache Activation Memory (DAMEM) and a Data Cache Output Memory (DOMEM) with the central computing units (CCU).

FIG. 2 schematically shows a CIM macro 10 of a GPCIM 12, which contains a Data Cache Activation Memory (DAMEM) 14 and a Data Cache Output Memory (DOMEM) 16 with the central computing units (CCU) 18. In certain aspects, the DAMEM 14 is a 32 bit 9T bitcell array, which supports both regular SRAM function and 1b multiplication for DNN by appending a 3T NAND gate 20 to a 6T SRAM 22. In certain aspects, the DOMEM 16 is an 8T bitcell array with 2 bitlines, which performs 2 read and 1 write within one clock cycle. An extra instruction cache 24 and weight SRAM 26 are added to support the DNN and CPU functions. As shown in FIG. 2, in DNN mode 28, the CIM macro uses the DAMEM 14 as input memory 30 for digital CIM MAC operation with stationary input and the DOMEM 16 as output memory 32. In CPU mode 34, the DAMEM 14 is used as a DAMEM data cache (Dcache) 36 and the DOMEM 16 acts as both a register file (RF) 38 and a DOMEM Dcache 40. Accordingly, the disclosed GPCIM 12 design reduces or eliminates data movement between the Dcache, RF, and pipeline stages found in traditional CPU designs. As shown in FIG. 2, a five-phase single-cycle operation 42 including write-back, pre/dis-charge, latch update and vector execution, is performed for the CPU/DNN operation (e.g., the DNN mode 28 and the CPU mode 34) from the DOMEM 16.

Figure 3:
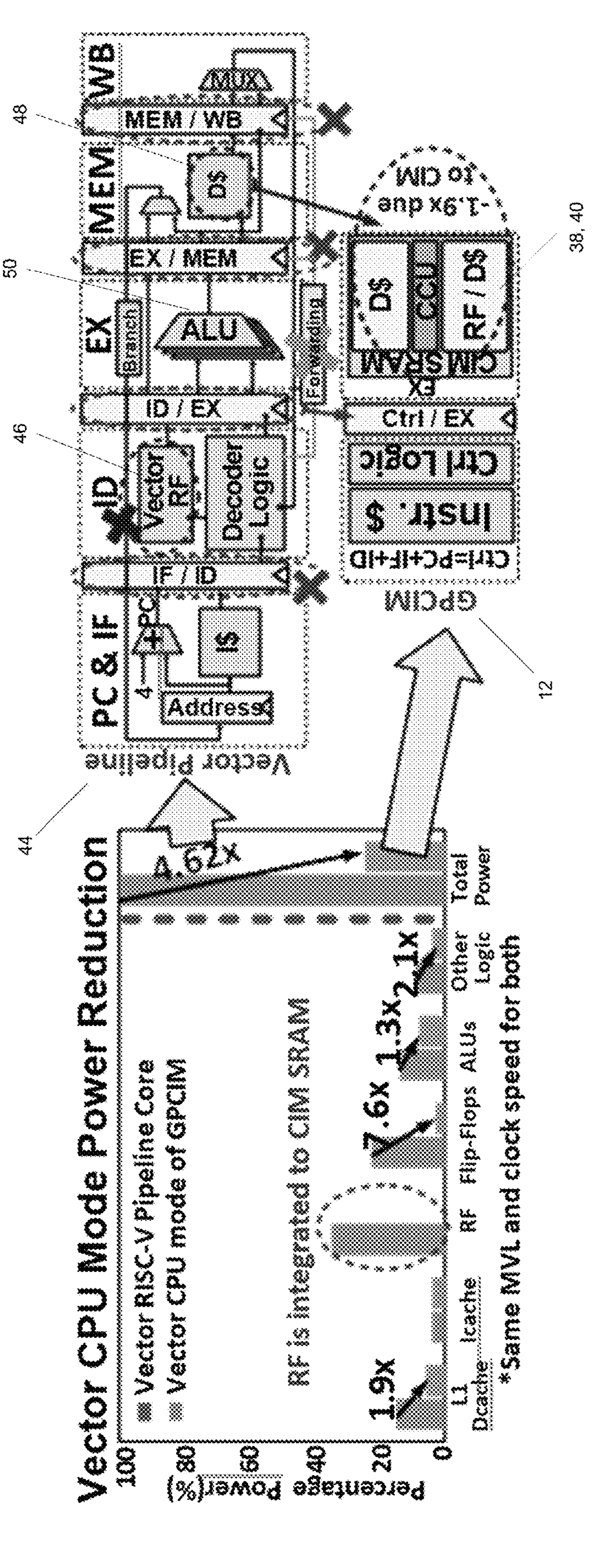
FIG. 3 schematically illustrates the significant power benefits of the GPCIM by exploiting the CIM's concise dataflow in comparison with an equivalent digital counterpart of vector RISC-V pipeline core with a vector L1 cache and a vector RF.

FIG. 3 schematically illustrates the significant power benefits of the GPCIM 12 by exploiting the CIM's concise dataflow in comparison with an equivalent digital counterpart of vector RISC-V pipeline core 44 with a vector L1 cache 46 and a vector RF 48. A shorter 2-stage pipeline in the GPCIM 12 leads to reduced flip-flops by 7.6×. The vector RF 48 is eliminated by integrating it into the CIM Dcache. Arithmetic logic units (ALUs) 50 are merged into the CIM macro 10 eliminating data cache access with 1.9× cache power saving and 1.3×ALU power savings. Certain pipeline logic in the RISC-V pipeline core 44, such as forwarding, is also removed with 0.1× logic power savings. A 4.62× total power reduction is achieved for the GPCIM 12.

Figure 4:
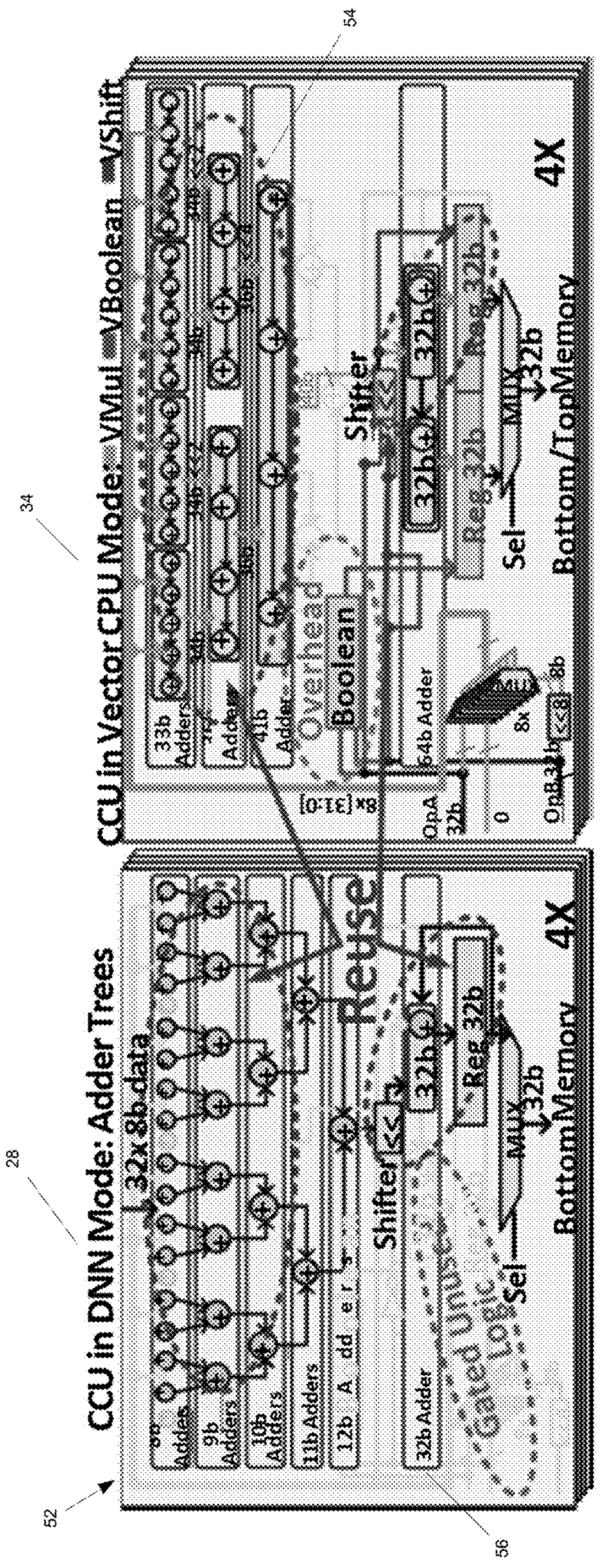
FIG. 4 schematically illustrates logic reuse in the CCU inside the CIM macro, according to certain aspects of the present disclosure.

FIG. 4 illustrates logic reuse in the CCU 18 inside the CIM macro 10. In certain aspects, in the DNN mode 28, the CCU 18 is configured as a plurality of adder trees 52 (e.g., four adder trees) to perform 8 bit MAC utilizing the 1b results from the DAMEM 14. It should be understood that the plurality of adder trees 52 can be any appropriate number of adder trees. In the CPU mode 34, logics 54 are reused to support different instructions. Extra logic beyond adder trees is also added for complete ALU functions. Input and clock gating are performed on unused logic in different modes. A customizable 32b instruction set architecture (ISA) 56 is designed to support integer vector CPU function.

Figure 5:
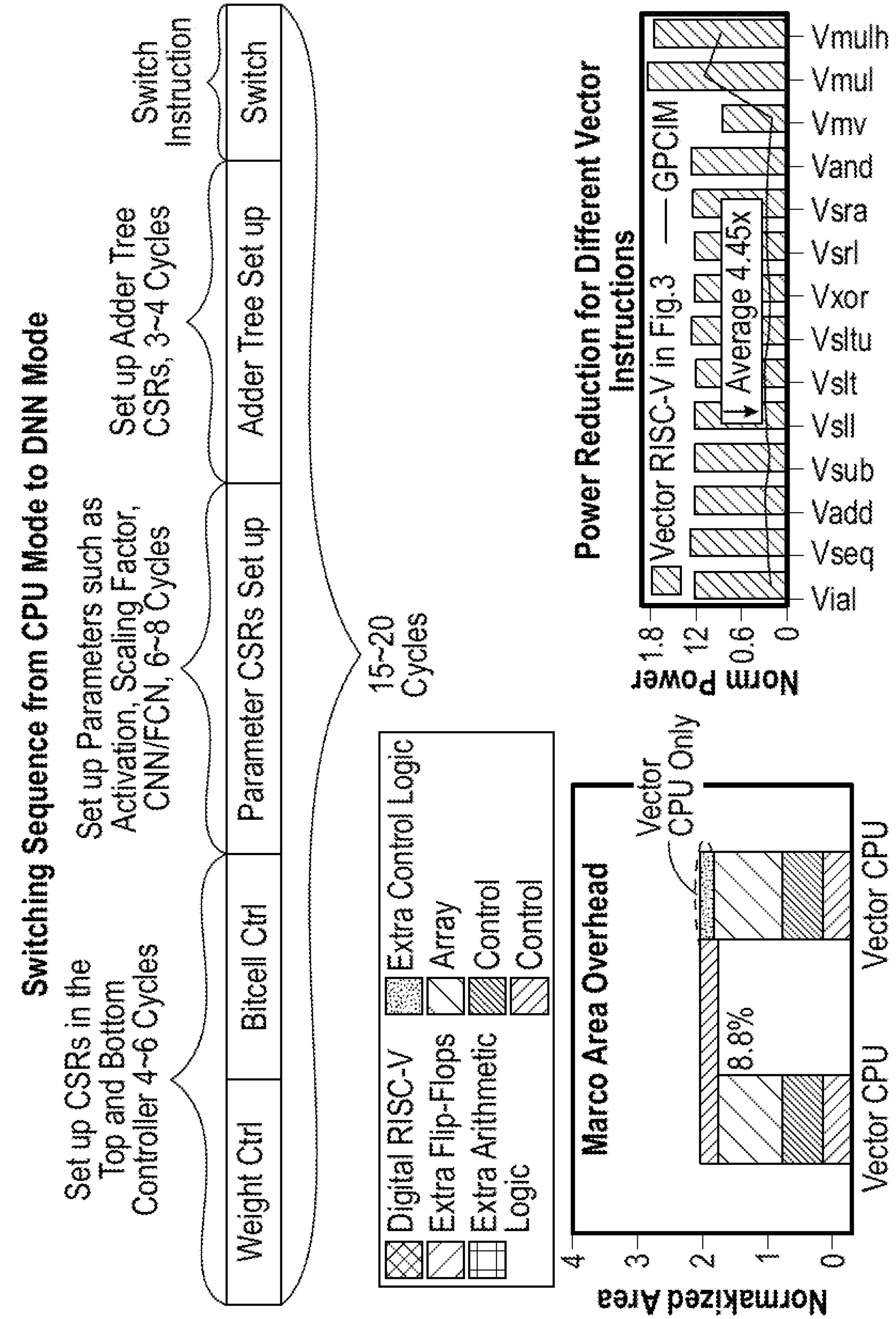
FIG. 5 schematically illustrates a 5b opcode defining different instruction types with the first 3 bits designated for locations of the operands and results.

As schematically illustrated in FIG. 5, a 5b opcode 58 defines different instruction types with the first 3 bits designated for locations of the operands and results. Special instructions such as "MVCSR", "SWITCH" and "PCS", are added to configure the control and status registers (CSR) for smooth mode switching between CPU (e.g., CPU mode 34) and CNN (e.g., DNN mode 28). Reconfiguration costs 8.8% area overhead on CIM macro 10 to support vector CPU operations.

Figure 6:
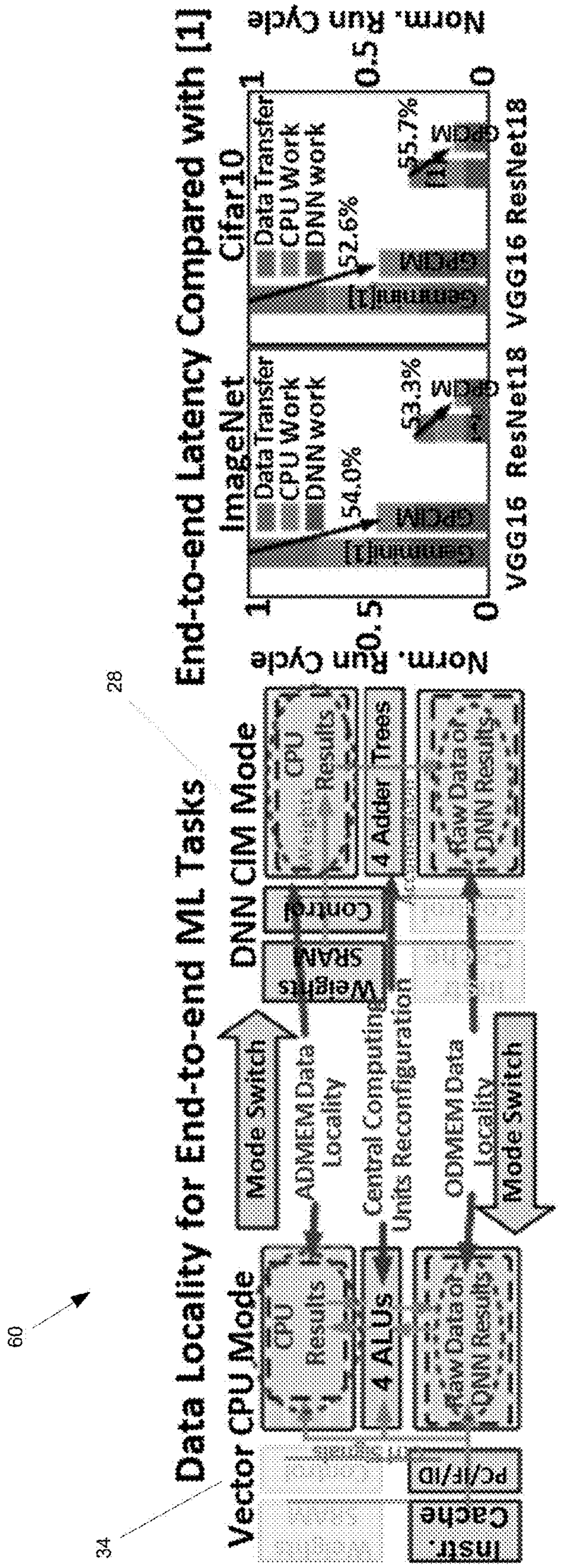
FIG. 6 schematically illustrates a data movement scheme facilitating end-to-end operation for both the CPU (e.g., CPU mode) and the CNN (e.g., DNN mode).

FIG. 6 schematically illustrates a data movement scheme 60 facilitating end-to-end operation for both the CPU (e.g., CPU mode 34) and the CNN (e.g., DNN mode 28). After vector CPU operation for preprocessing, the CPU stores the CNN input data to the DAMEM 14 so that the GPCIM 12 can directly process the first layer of CNN without any data transfer in conventional architecture. After CNN processing, the data preparation such as data alignment, batch normalization and padding between different layers are performed seamlessly by the CPU by configuring the DOMEM 16 to the DOMEM Dcache 36 avoiding further data movement. As shown in FIG. 6, the GPCIM 12 achieves 52~56% end-to-end latency improvement for the CNN tasks (e.g., CPU mode 34) due to elimination of data transfer and parallel vector processing compared with Gemmini using a scalar RISC-V CPU and an accelerator.

Figure 7:
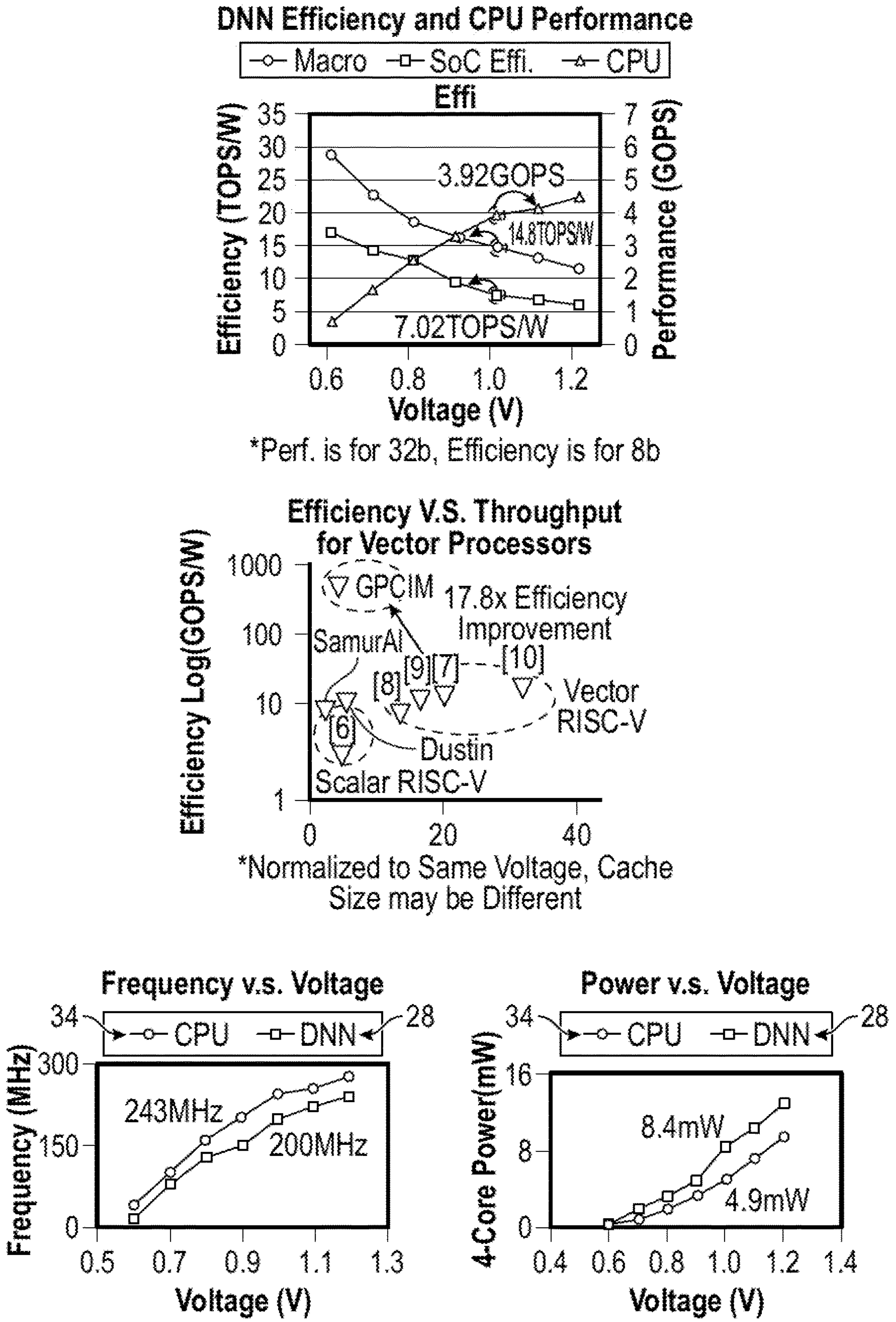
FIG. 7 schematically illustrates charts, graphs, a die photo of a 65 nm test chip, according to certain aspects of the present disclosure, and a comparison table.
Figure 7:
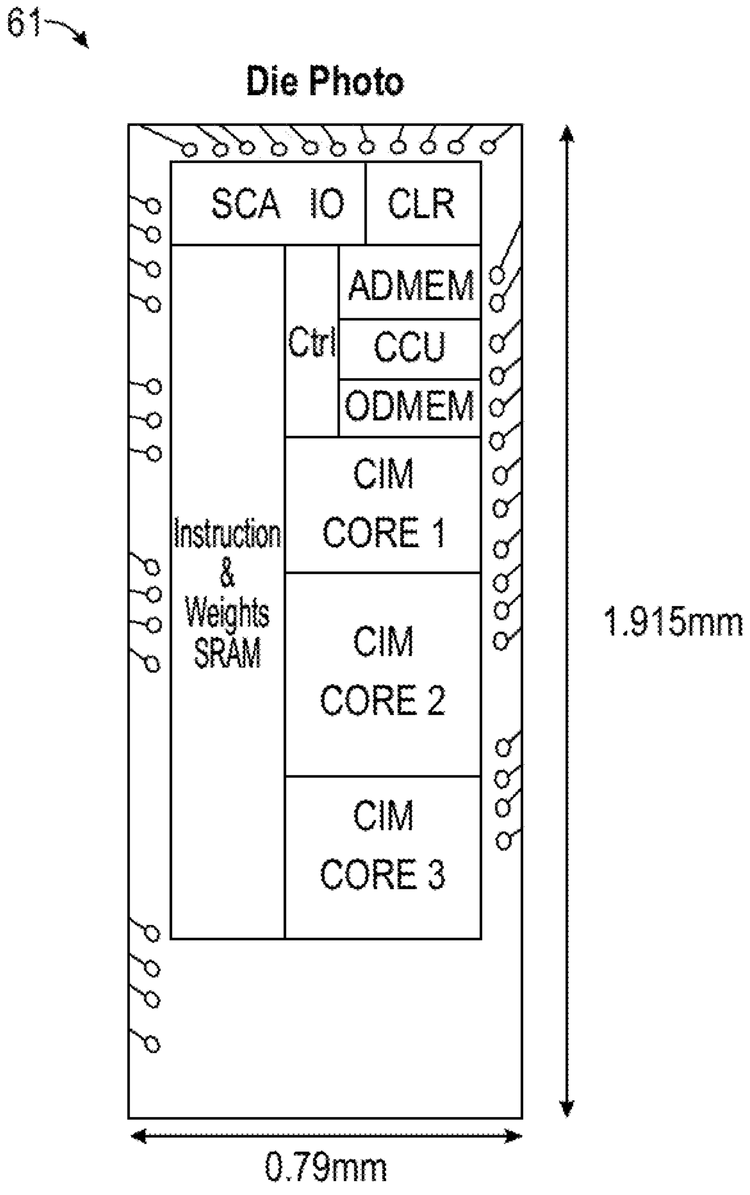

With reference to FIG. 7, in certain aspects, a 65 nm test chip is fabricated with a nominal supply of 1.0V. As shown, for the DNN mode 28, the GPCIM 12 achieves a 7.62~17.8TOPS/W 8-bit system energy efficiency and a 14.8~28.5TOPS/W macro energy efficiency matching prior CIM CNN performance. The GPCIM 12 achieves the highest CPU efficiency, more than 17.8× improvement compared with prior 4 vector RISC-V CPU and 3 scalar RSIC-V CPU despite a lower throughput due to slower operating frequency and less vectors (scalable) being implemented. A comparison table 62 comparing the disclosed technology with prior CIM and RISC-V CPUs is also shown in FIG. 7. Compared with a prior instruction supported CIM, the CIM 10 achieves 7.3× efficiency improvement for 32b MUL instruction. Compared with a recent conventional reconfigurable ASIC+CPU digital design, the GPCIM 12 achieves 10× higher DNN efficiency and 118× higher CPU efficiency.

Figure 8:
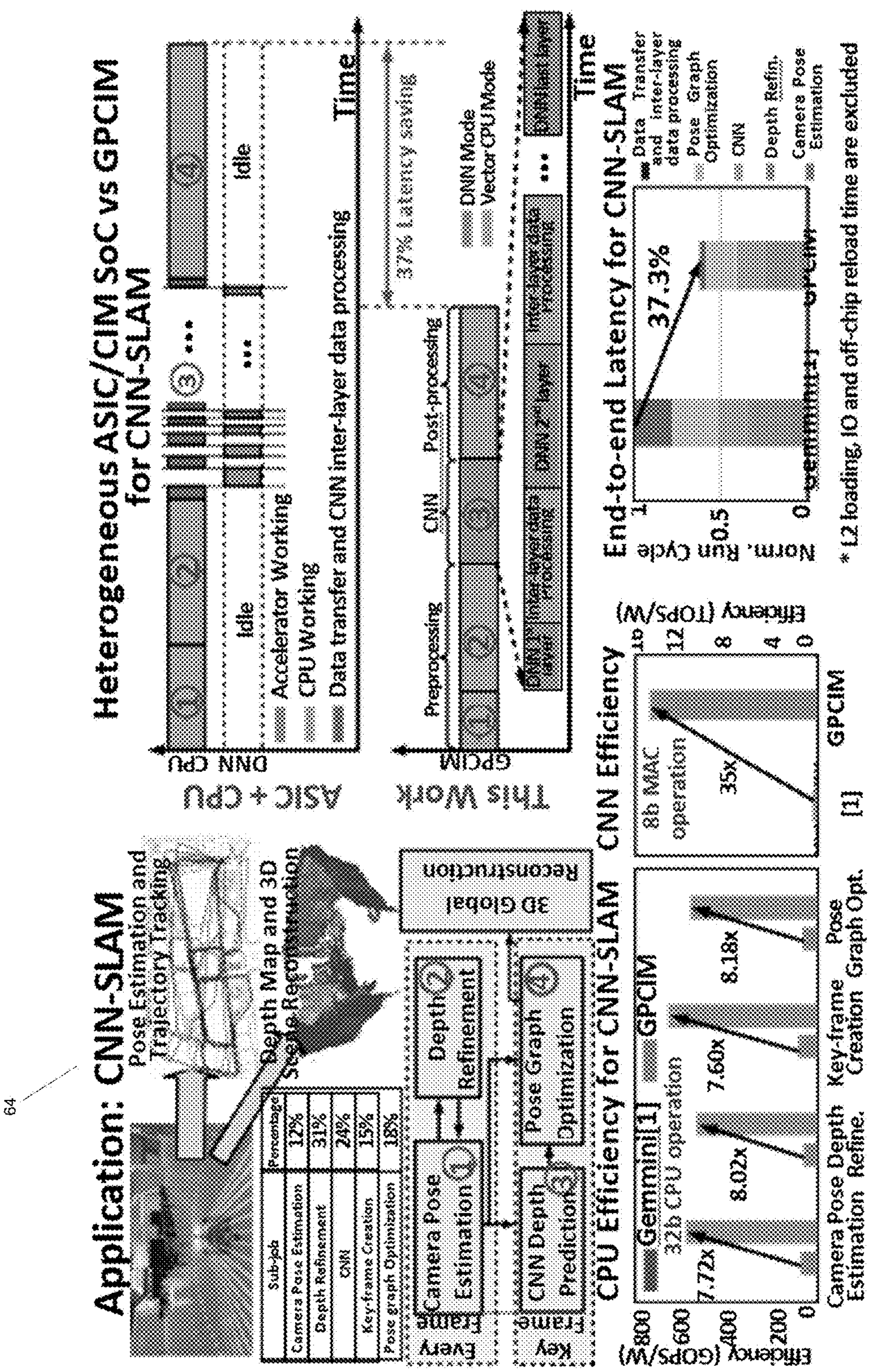
FIG. 8 schematically illustrates a detailed end-to-end case study from the GPCIM using a CNN-based Simultaneous Localization and Mapping (SLAM) task for mobile robots.

FIG. 8 schematically illustrates a detailed end-to-end case study from the GPCIM 12 using a CNN-based Simultaneous Localization and Mapping (SLAM) 64 task for mobile robots. 76% operations including pre-processing (such as, but not limited to, camera pose estimation, depth refinement) and post-processing (such as, but not limited to, key-frame creation, graph pose optimization) need to be performed by the CPU due to the non-CNN operations such as division and exponentiation which are challenging for conventional CIM+CPU architecture. For the SLAM 64 task, the GPCIM 12 achieves 35×CNN efficiency improvement, 7.9×CPU efficiency improvement, 37% end-to-end latency improvement, compared with Gemmini.

Figure 9:
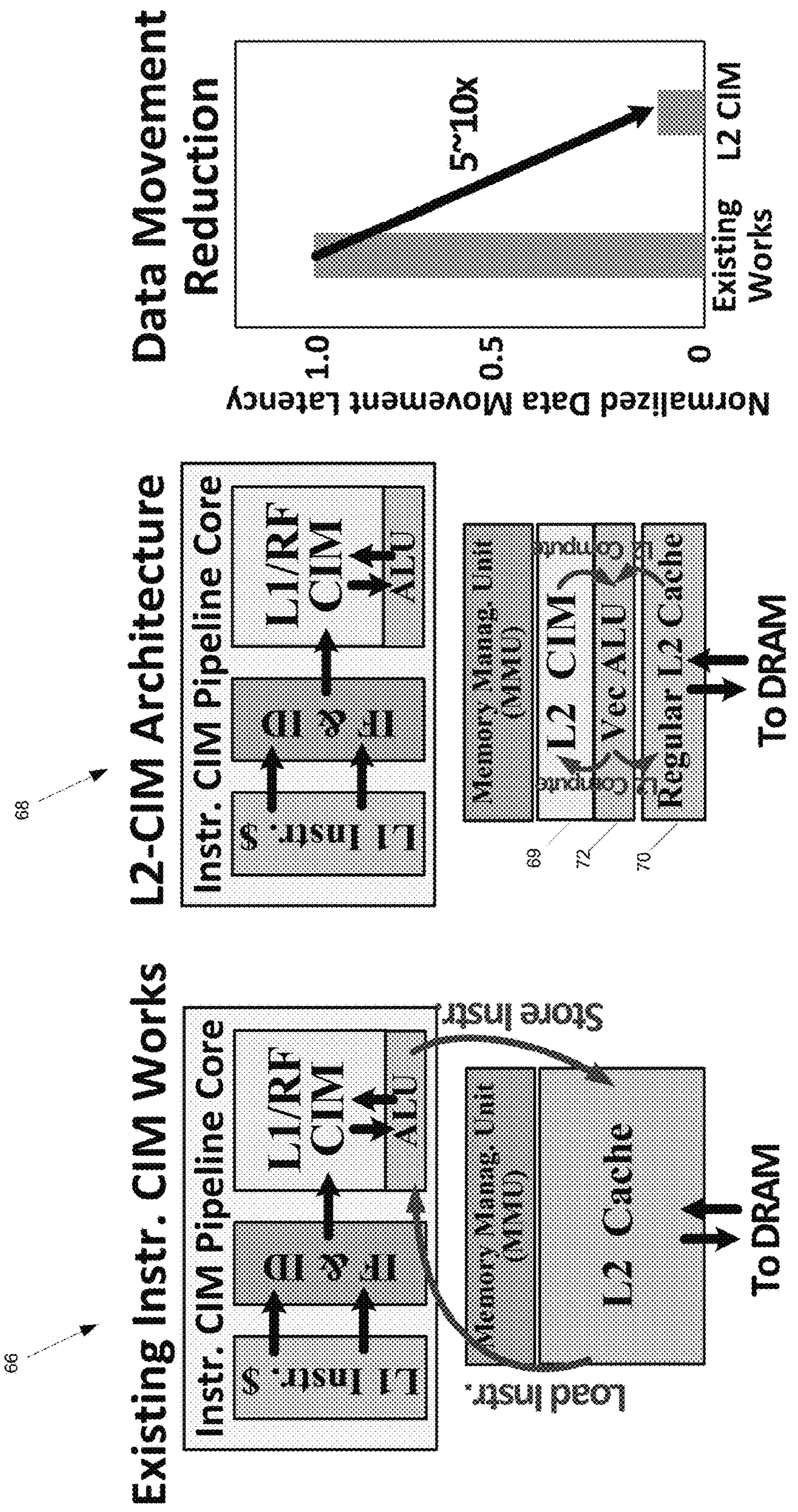
FIG. 9 schematically illustrates a traditional CIM work compared to an L2-CIM architecture with data movement reduction, according to certain aspects of the present disclosure.

FIG. 9 schematically illustrates a traditional CIM work 66 compared to an L2-CIM architecture 68 with data movement reduction, according to certain aspects of the present disclosure. The L2-CIM architecture 68 contains a L2 CIM 69 and a complete cache hierarchy with L2 cache 70 using vectorized instruction-controlled compute-in-memory function 72. Compared to a complete cache system for traditional GP-CIMs, the L2-CIM architecture 68 can significantly reduce the data loading and replacing latency inside the cache hierarchy by keeping the computing locally in the L2 cache 70 to reach high system performance.

Many traditional instruction-based compute-in-memory (CIM) works, such as the traditional CIM work 66, are focusing on implementing the ALU logic in/near the first level SRAM storage such as L1 cache and register files (RF). However, modern processors for general-purpose computing contain multiple levels of caches. The data movement through cache hierarchy is one significant portion of CPU processing, especially for ML/AI tasks which have tremendous input/weight data. While the existing conventional instruction based CIM works can dramatically improve the energy efficiency of CPU pipeline core, the ignored heavy data movement through cache hierarchy holds back the whole CPU system efficiency. In contrast, the L2 CIM architecture 68 of the present disclosure optimizes the CPU processing efficiency including the cache system. As for recent large AI/ML tasks, the conventional L1 cache and RF are not enough to store the input/weight data, which means the majority of the data for ML/AI computing is stored in the low-level caches such as L2 cache 70. L2-CIM architecture 68 can process majority of the data locally at L2 cache 70 level instead of moving all data to L1. As shown in FIG. 9, for example, considering a 2-level cache system, by implementing CIM techniques into L2 cache 70, the disclosed approach can reduce the 5~10× data loading and replacing effort, which is advantageous over the traditional CPU and existing instruction based CIM architectures.

Figure 10:
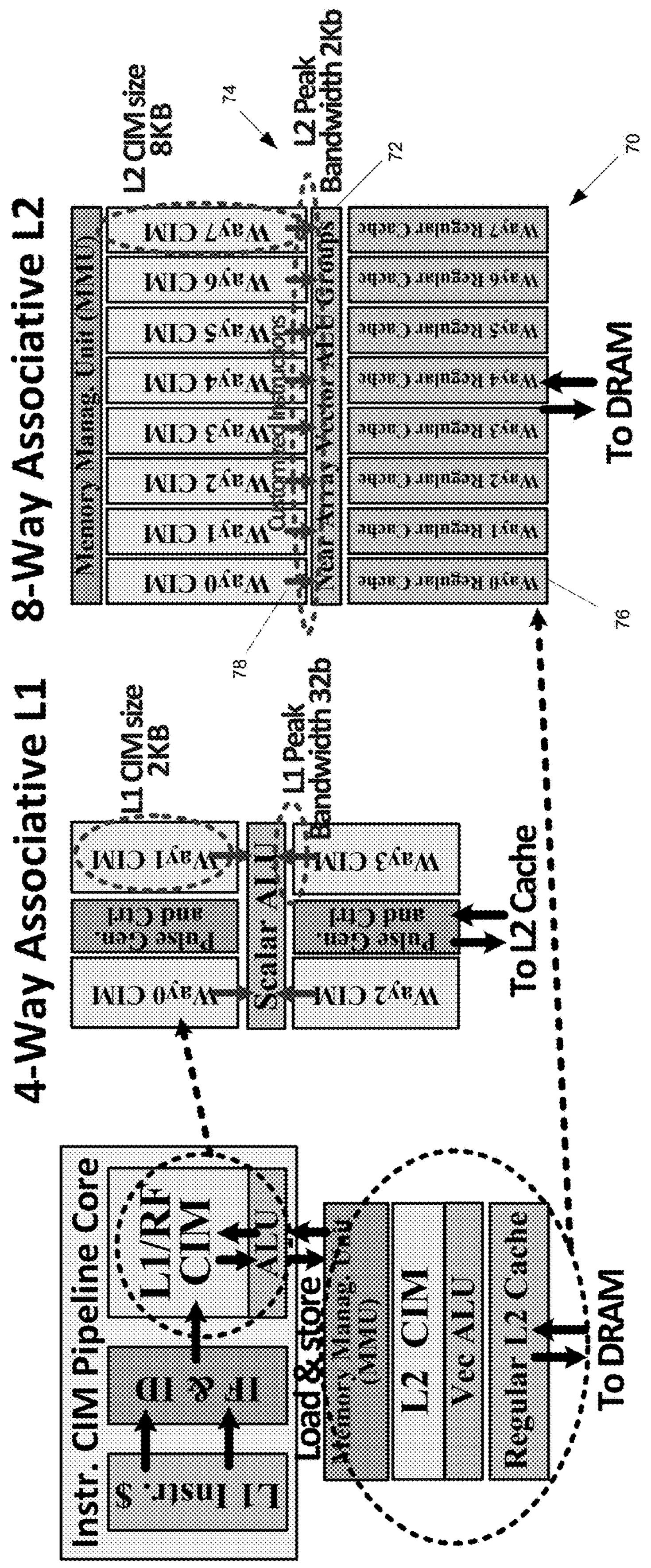
FIG. 10 schematically illustrates the L2-CIM architecture depicting performance improvement, according to certain aspects of the present disclosure.

FIG. 10 schematically illustrates the L2-CIM architecture 68 depicting performance improvement. The L2-CIM 69 has a peak performance vector processing mode 74 that utilizes all the L2 cache banks 76 of the L2 cache 70 as general-purpose vector CIM core with maximum L2 bandwidth cooperating with customized RISC-V instruction set extension 78 and customized replacement policy.

The disclosed L2-CIM 69 fully utilizes the potential maximum bandwidth and large SRAM size of the L2 cache 70 for vectorized parallel in-memory computing to reach superior performance and energy efficiency improvement over conventional GP-CIM works.

For example, in cache hierarchy of traditional CPU architecture, in order to achieve higher hit rate and reduce the averaged memory access time, low level cache, such as L2 cache, has more SRAM banks with larger bank size for high associativity compared with L1 cache. In that case, the potential memory bandwidth of L2 cache is significantly large. In the L2 CIM architecture 68, CIM 69 in L2 cache 70 can fully utilize the potential L2 bandwidth and L2 cache size by cooperating with special designed replacement policy and customized RISC-V vector set extension 80. A representative example is shown in FIG. 10 with a 2-level cache hierarchy. L1 is a 4-way associative cache group and L2 is a 8-way associative cache group. The L2 CIM 69 of the present disclosure can reach 64× peak performance improvement compared with conventional instruction based CIM architecture, which only supports L1/RF CIM.

Figure 11:
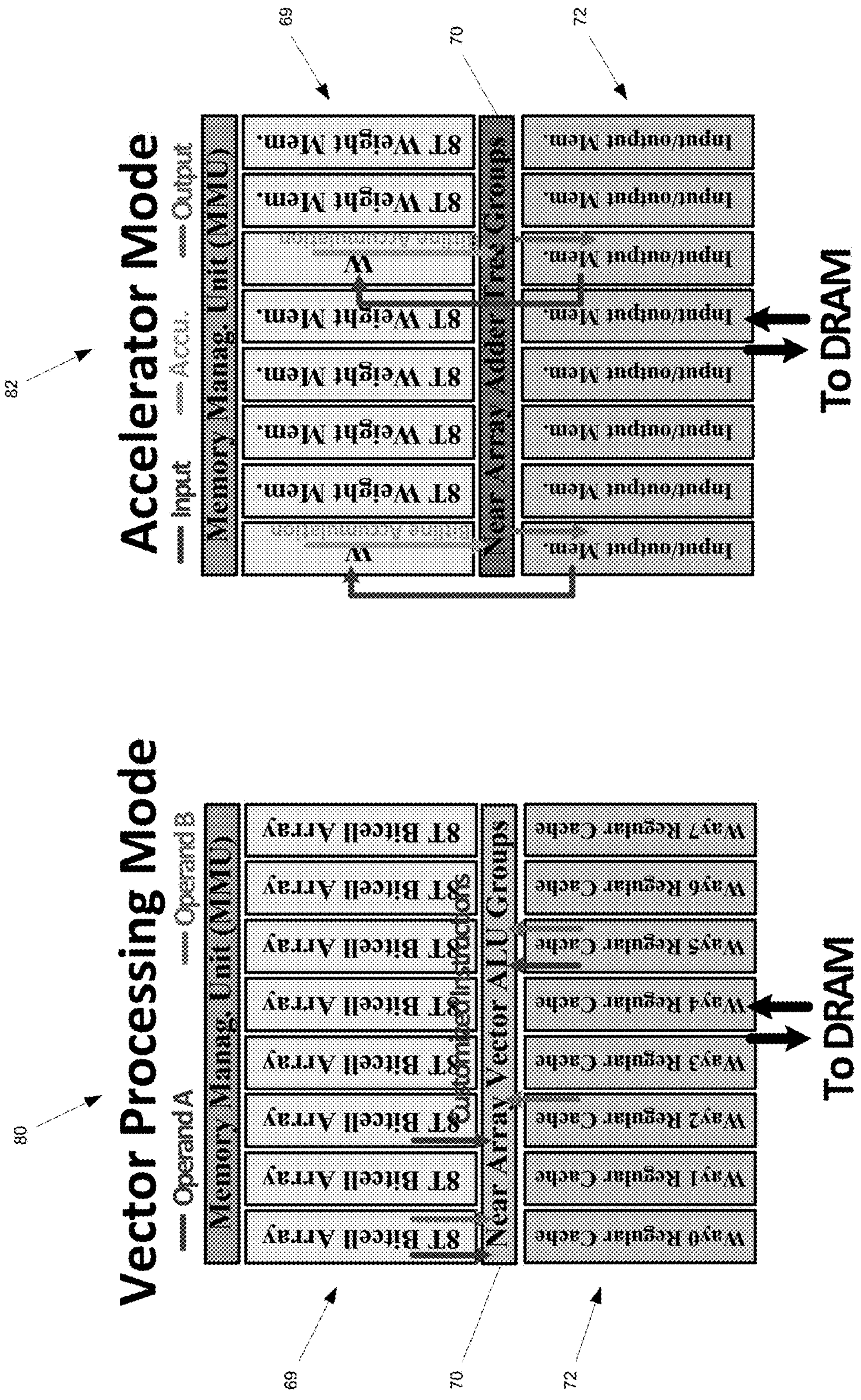
FIG. 11 schematically illustrates two reconfiguration modes (e.g., vector processing mode and accelerator mode) of the L2-CIM architecture, according to certain aspects of the present disclosure.

FIG. 11 schematically illustrates two reconfiguration modes (e.g., vector processing mode 80 and accelerator mode 82) of the L2-CIM architecture 68, according to certain aspects of the present disclosure. The vector CIM mode (e.g., the vector processing mode 80) is for application with complicated vectorized parallel processing. The accelerator CIM mode (e.g., the accelerator mode 82) is for AI/ML model inference.

The L2-CIM architecture 68 enables the low-level cache (e.g., the L2 cache 70) to support general-purpose vector CIM processing (e.g., the vector processing mode 80) and accelerator processing (e.g., the accelerator mode 82). It enables a wide range of both ML/AI and vector processing applications with high system energy efficiency.

For example, in the vector processing mode 80, the L2 CIM 69 part is an instruction controlled CIM core. The processing is finished in the near-array vector ALU groups 70. The vector processing mode 80 is designed for the general-purpose vector computing waves which has more complicated computing kernel than the MAC operation in ML. The accelerator mode 82 reconfigures the L2 CIM 69 part to a weight memory for CIM MAC operations. The near-array vector ALU groups 70 can be reconfigured to adder tree groups (e.g., plurality of adder trees 52) for partial sum accumulation. Instead of finishing all the processing work in the near-array logic groups, the accelerator mode 82 realizes 1b multiplication inside the bitcell and accumulates the column results using bitline. The accelerator mode 82 is implemented for the most efficient ML model inference of AI applications for this L2 CIM architecture 68.

In one aspect, a method may be an operation, an instruction, or a function and vice versa. In one aspect, a clause or a claim may be amended to include some or all of the words (e.g., instructions, operations, functions, or components) recited in either one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A compute-in-memory processor, comprising:

central computing units configured to operate in a central processing unit mode and a deep neural network mode;

a data activation memory in communication with the central computing units; and a data cache output memory in communication with the central computing units, wherein, in the deep neural network mode, the data activation memory is configured as input memory and the data cache output memory is configured as output memory, and wherein, in the central processing unit mode, the data activation memory is configured as a first data cache and the data cache output memory is configured as a register file and a second data cache, wherein the data activation memory comprises a bitcell array configured to support, in the deep neural network mode, SRAM function and 1-bit multiplication.

2. The compute-in-memory processor of claim 1, wherein the bitcell array is a 32 bit 9 transistor bitcell array.

3. The compute-in-memory processor of claim 2, wherein the bitcell array comprises a 3 transistor NAND gate appended to a 6 transistor SRAM.

4. A compute-in-memory processor, comprising:

central computing units configured to operate in a central processing unit mode and a deep neural network mode;

a data activation memory in communication with the central computing units; and a data cache output memory in communication with the central computing units, wherein, in the deep neural network mode, the data activation memory is configured as input memory and the data cache output memory is configured as output memory, and wherein, in the central processing unit mode, the data activation memory is configured as a first data cache and the data cache output memory is configured as a register file and a second data cache, wherein the data cache output memory comprises a bitcell array, wherein the bitcell array comprises 2 bitlines configured to perform 2 read operations and 1 write operation within one clock cycle.

5. The compute-in-memory processor of claim 4, wherein the bitcell array is an 8 transistor bitcell array.

6. A compute-in-memory processor, comprising:

central computing units configured to operate in a central processing unit mode and a deep neural network mode;

a data activation memory in communication with the central computing units; and a data cache output memory in communication with the central computing units, wherein, in the deep neural network mode, the data activation memory is configured as input memory and the data cache output memory is configured as output memory, and wherein, in the central processing unit mode, the data activation memory is configured as a first data cache and the data cache output memory is configured as a register file and a second data cache, wherein the central computing units comprise a plurality of adder trees configured to perform 8 bit MAC based on 1-bit results from the data activation memory.

7. The compute-in-memory processor of claim 6, wherein the plurality of adder trees comprise four adder trees.

8. A compute-in-memory processor, comprising:

central computing units configured to operate in a central processing unit mode and a deep neural network mode;

a data activation memory in communication with the central computing units;

a data cache output memory in communication with the central computing units, wherein, in the deep neural network mode, the data activation memory is configured as input memory and the data cache output memory is configured as output memory, and wherein, in the central processing unit mode, the data activation memory is configured as a first data cache and the data cache output memory is configured as a register file and a second data cache; and a customizable instruction set architecture configured to support integer vector CPU function in the central processing unit mode.

9. The compute-in-memory processor of claim 8, wherein the customizable instruction set architecture is a customizable 32b instruction set architecture.

10. A computer-implemented method, comprising:

operating central computing units in a central processing unit mode; wherein, in the central processing unit mode, a data activation memory in communication with the central computing units is configured as a first data cache and a data cache output memory, in communication with the central computing units, is configured as a register file and a second data cache; and selectively operating the central computing units from the central processing unit mode to a deep neural network mode, wherein, in the deep neural network mode, the data activation memory is configured as input memory and the data cache output memory is configured as output memory, wherein the data activation memory comprises a bitcell array configured to support, in the deep neural network mode, SRAM function and 1-bit multiplication.

11. The computer-implemented method of claim 10, wherein the bitcell array is a 32 bit 9 transistor bitcell array.

12. The computer-implemented method of claim 11, wherein the bitcell array comprises a 3 transistor NAND gate appended to a 6 transistor SRAM.

13. The computer-implemented method, comprising:

operating central computing units in a central processing unit mode; wherein, in the central processing unit mode, a data activation memory in communication with the central computing units is configured as a first data cache and a data cache output memory, in communication with the central computing units, is configured as a register file and a second data cache; and selectively operating the central computing units from the central processing unit mode to a deep neural network mode, wherein, in the deep neural network mode, the data activation memory is configured as input memory and the data cache output memory is configured as output memory, wherein the data cache output memory comprises a bitcell array, wherein the bitcell array comprises 2 bitlines configured to perform 2 read operations and 1 write operation within one clock cycle.

14. A computer-implemented method, comprising:

operating central computing units in a central processing unit mode; wherein, in the central processing unit mode, a data activation memory in communication with the central computing units is configured as a first data cache and a data cache output memory, in communication with the central computing units, is configured as a register file and a second data cache; and selectively operating the central computing units from the central processing unit mode to a deep neural network mode, wherein, in the deep neural network mode, the data activation memory is configured as input memory and the data cache output memory is configured as output memory, wherein the central computing units comprise a plurality of adder trees configured to perform 8 bit MAC based on 1-bit results from the data activation memory.

15. The computer-implemented method, comprising:

operating central computing units in a central processing unit mode; wherein, in the central processing unit mode, a data activation memory in communication with the central computing units is configured as a first data cache and a data cache output memory, in communication with the central computing units, is configured as a register file and a second data cache; and selectively operating the central computing units from the central processing unit mode to a deep neural network mode, wherein, in the deep neural network mode, the data activation memory is configured as input memory and the data cache output memory is configured as output memory, wherein, in the central processing unit mode, the central computing unit is configured to support integer vector CPU function via a customizable instruction set architecture.

16. The computer-implemented method of claim 15, wherein the customizable instruction set architecture is a customizable 32b instruction set architecture.

17. A compute-in-memory processor, comprising:

central computing units configured to operate in a central processing unit mode and a deep neural network mode;

a first level cache in communication with the central computing units; and a second level cache in communication with the central computing units, wherein the second level cache comprises a plurality of SRAM banks, wherein, in the central processing unit mode, a second level compute-in-memory in communication with the second level cache is configured as an instruction controlled compute-in-memory core, and wherein, in the deep neural network mode, the second level compute-in-memory is configured as a weight memory for compute-in-memory MAC operations, wherein, in the deep neural network mode, a near-array vector ALU in communication with the second level cache is configured as a plurality of adder trees for partial sum accumulation.

* * * * *